(12) United States Patent
Yang

(10) Patent No.: US 7,656,724 B2
(45) Date of Patent: Feb. 2, 2010

(54) SEMICONDUCTOR INTEGRATED CIRCUIT HAVING DATA INPUT/OUTPUT CIRCUIT AND METHOD FOR INPUTTING DATA USING THE SAME

(75) Inventor: Sun-Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 291 days.

(21) Appl. No.: 11/647,490

(22) Filed: Dec. 29, 2006

(65) Prior Publication Data

US 2007/0291573 A1   Dec. 20, 2007

(30) Foreign Application Priority Data

Jun. 8, 2006   (KR) .................. 10-2006-0051328

(51) Int. Cl.
    *G11C 7/10* (2006.01)
(52) U.S. Cl. .................. 365/189.17; 365/189.14; 365/189.18; 365/189.05; 365/230.03
(58) Field of Classification Search ........... 365/189.14, 365/189.17, 189.18, 189.05, 230.03; 375/211
    See application file for complete search history.

(56) References Cited

U.S. PATENT DOCUMENTS

| | | | |
|---|---|---|---|
| 6,647,455 B2 | 11/2003 | Smits et al. | |
| 7,054,220 B2 | 5/2006 | Kwean | |
| 2001/0000991 A1* | 5/2001 | Sakamoto et al. | 365/190 |
| 2003/0005225 A1* | 1/2003 | Smits | 711/119 |
| 2003/0043682 A1* | 3/2003 | Usuki et al. | 365/230.03 |
| 2003/0076734 A1* | 4/2003 | Ryan et al. | 365/233 |
| 2004/0047404 A1* | 3/2004 | Kim | 375/211 |
| 2004/0057304 A1* | 3/2004 | Smits | 365/200 |

FOREIGN PATENT DOCUMENTS

| | | |
|---|---|---|
| JP | 2002-74952 | 3/2002 |
| JP | 2002-74952 A | 3/2002 |
| KR | 1020040022905 | 3/2004 |
| KR | 1020040095988 | 11/2004 |
| KR | 1020050000990 | 1/2005 |
| KR | 1020060026313 | 3/2006 |

\* cited by examiner

Primary Examiner—Amir Zarabian
Assistant Examiner—Jay Radke
(74) Attorney, Agent, or Firm—Venable LLP; Jeffri A. Kaminski

(57) ABSTRACT

An apparatus includes a control unit for generating an input control signal to select a global input/output line to which data is transmitted. A repeater receives data from the global input/output line to output the data to a global input/output line corresponding to the input control signal. A plurality of input drivers receive the data from the repeater to transmit the data to a local input/output line connected to each memory bank.

34 Claims, 5 Drawing Sheets

SEMICONDUCTOR INTEGRATED CIRCUIT HAVING DATA INPUT/OUTPUT CIRCUIT AND METHOD FOR INPUTTING DATA USING THE SAME

FIELD OF THE INVENTION

1. Technical Field

The present invention relates to a semiconductor integrated circuit and a method for inputting data using the same, and more particularly, to a semiconductor integrated circuit having a data input/output circuit capable of reducing power consumption and a method for inputting data using the same.

2. Related Art

In general, a semiconductor integrated circuit includes a data input/output circuit. The data input/output circuit selectively performs operations of inputting and outputting data depending on whether an operation control signal is enabled or not. During the data input operation of the semiconductor integrated circuit, the data input/output circuit buffers input data using a data input buffer and transmits the buffered input data to an input driver through a global input/output line, which is a bundle of data input/output lines of a plurality of memory banks.

On the other hand, during the data output operation of the semiconductor integrated circuit, the data input/output circuit transmits data from a local input/output line through an output sense amplifier to the global input/output line, buffers the data transmitted from the global input/output line using a data output buffer, and outputs the buffered data.

In this case, since the global input/output line is required to transmit data to a plurality of memory banks disposed in the semiconductor integrated circuit, data loss may occur due to the resistance of the global input/output line due to the length of the global input/output line. Further, as the integration density of the semiconductor integrated circuit increases, the influence of noise between adjacent lines also becomes relevant. Therefore, a conventional semiconductor integrated circuit includes a repeater in the global input/output line in order to prevent malfunctions, such as data loss.

In addition, the conventional semiconductor integrated circuit enables one or only a few memory banks instead of enabling all memory banks at the same time to perform data input/output operations in an active mode.

However, in the conventional semiconductor integrated circuit, data is transmitted to not only enabled memory banks but also disabled memory banks, so that power consumption increases.

SUMMARY OF THE INVENTION

An embodiment of the present invention provides to a semiconductor integrated circuit having a data input/output circuit capable of reducing power consumption.

Also, an embodiment of the present invention also provides a method for inputting data using a semiconductor integrated circuit having a data input/output circuit in which data is transmitted to only enabled data bank regions during a data input operation to prevent unnecessary current generation.

An embodiment of the present invention also provides a semiconductor integrated circuit including: a control unit for generating an input control signal to select a global input/output line to which data is transmitted; a repeater for receiving data from the global input/output line to output the data to a global input/output line corresponding to the input control signal; and a plurality of input drivers for receiving the data from the repeater to transmit the data to a local input/output line connected to each memory bank.

Another embodiment of the present invention provides a semiconductor integrated circuit including: a control unit for receiving bank address data on a memory bank region to be enabled among a plurality of memory banks to generate an input control signal; and a repeater for receiving data transmitted from a global input/output line to transmit the data to an input driver corresponding to the input control signal.

Still another embodiment of the present invention provides a semiconductor integrated circuit including a repeater for receiving data from a global input/output line to select a first bank group in response to the enabling of a control signal and for receiving the data from the global input/output line to select a second bank group in response to the disabling of the control signal.

Yet another aspect of the present invention provides a method for inputting data using a semiconductor integrated circuit, including: generating an input control signal to select a global input/output line to which data is transmitted; receiving data transmitted from the global input/output line to output the data to a global input/output line corresponding to the input control signal; and transmitting the output data to a local input/output line connected to each memory bank.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
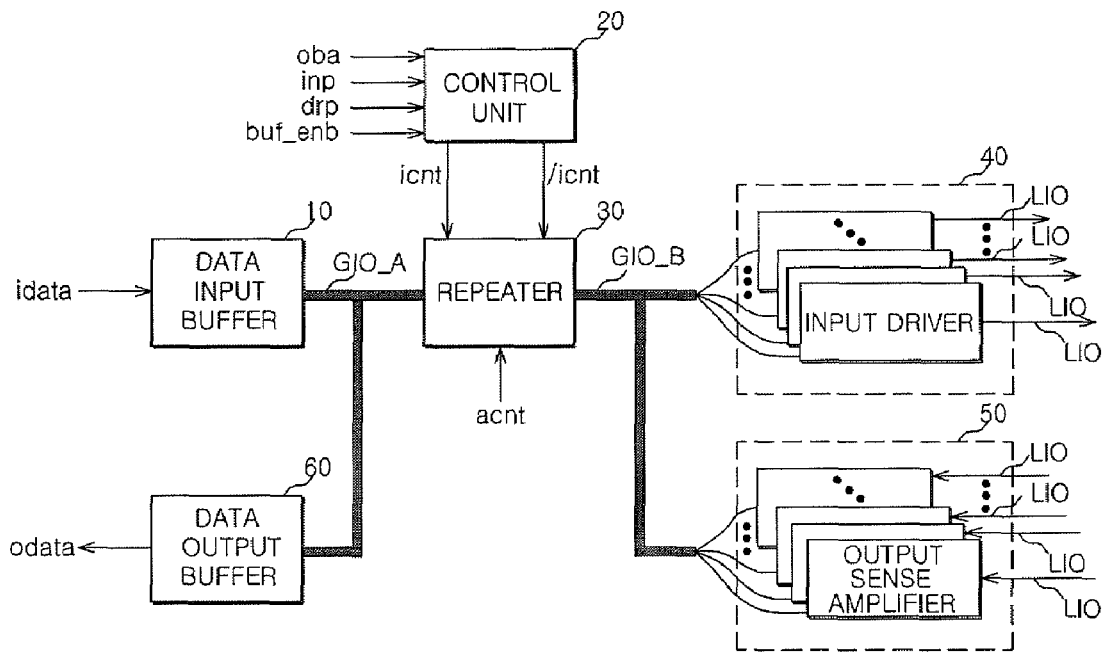
FIG. 1 is a block diagram of a data input/output circuit of a semiconductor integrated circuit according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Referring to FIG. 1, a data input/output circuit may include a data input buffer 10, a control unit 20, a repeater 30, an input driver 40, an output sense amplifier 50, and a data output buffer 60.

The data input buffer 10 transmits externally input data "idata" to a global input/output line GIO_A. The global input/output lines GIO_A and GIO_B, which refer to a bundle of data input/output lines, are illustrated as a line in FIG. 1. However, the data input/output lines serve to transmit data separately, and each of the data input/output lines is connected to one input driver 40 and one output sense amplifier 50.

Data input and output operations of the repeater 30 are determined by a potential level of an operation control signal "acnt". 1-bit bank address "oba" input to the control unit 20, which is one bit of a plural-bit (e.g., 3-bit) bank address, stores data on the enabling of some memory banks (e.g., four memory banks) of a plurality of memory banks (e.g., 8 memory banks) during a data input operation of a semiconductor integrated circuit. Although it is exemplarily described that a plurality of memory banks are divided into two regions and enabled, the number of regions into which the memory banks are divided in the semiconductor memory apparatus is not limited to the above description.

During the data input operation of the semiconductor integrated circuit, when the 1-bit bank address "oba" is input to the control unit 20 and an input instruction signal "inp", a drive instruction signal "drp", and a buffer enable signal "buf_enb" are enabled, an input control signal "icnt" is generated. In this case, a pair of input control signals "icnt" and "/icnt" allows the repeater 30 to select some data input/output lines out of the global input/output line GIO_A and GIO_B in response to a potential level of the input control signals "icnt" and "/icnt".

Meanwhile, the externally input data "idata" is transmitted to the global input/output line GIO_A through the data input buffer 10. Thereafter, the repeater 30 outputs the data from the global input/output line GIO_B only to some data input/output lines of the global input/output line GIO_B in response to the input control signals "icnt" and "/icnt". Thus, a part (e.g., four) of a plurality of input drivers (e.g., 8 input drivers) 40 receives the data and performs its own operations. In this process, the transmission of data to disabled memory banks is prevented, thus reducing power consumption.

During a data output operation of the semiconductor memory apparatus, the data from the memory banks is transmitted to the output sense amplifier 50 and then to the repeater through the global input/output line GIO_B. The repeater 30 transmits the input data to the data output buffer 60 again so that the input data is output as output data "odata". In this case, since every data input to the data input/output circuit is output through the data output buffer 60, power loss does not occur.

Figure 2:
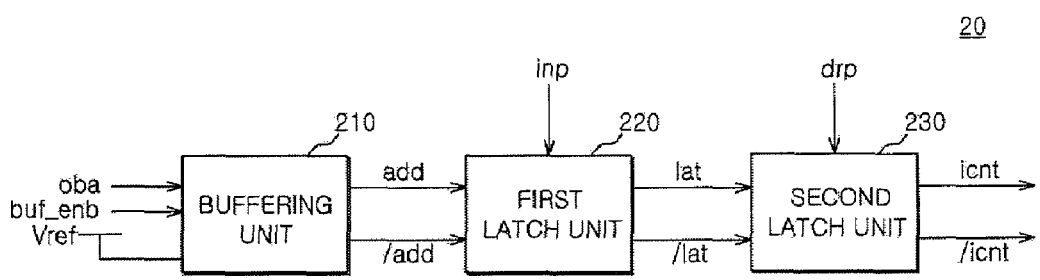
FIG. 2 is a block diagram of a control unit shown in FIG. 1.

The control unit 20 receives the 1-bit bank address "oba", the input instruction signal "inp", the drive instruction signal "drp", and the buffer enable signal "buf_enb" and generates the pair of input control signals "icnt" and "/icnt". The control unit 20 includes a buffering unit 210, a first latch unit 220, and a second latch unit 230 as shown in FIG. 2. Specifically, the buffering unit 210 receives a reference voltage Vref and the buffer enable signal "buf_enb", buffers the 1-bit bank address "oba", to generate a pair of address signals "add" and "/add". The first latch unit 220 latches the address signals "add" and "/add" depending on whether or not the input instruction signal "inp" is enabled. Also, the second latch unit 230 latches a pair of latch signals "lat" and "/lat", which are transmitted from the first latch unit 220, depending on whether or not the drive instruction signal "drp" is enabled and generates the pair of input control signals "icnt" and "/icnt".

The input instruction signal "inp" is required to instruct the data input operation of the data input/output circuit. The input instruction signal "inp" is usually used along with an output instruction signal to control the data input/output operations of the global input/output line GIO_A and GIO_B. The drive instruction signal "drp" is required to control the second latch unit 230 to generate the pair of input control signals "icnt" and "/icnt". The drive instruction signal "drp" is used to instruct the operations of drivers connected to the global input/output line GIO_A and GIO_B. Hereinafter, the functions of the input instruction signal "inp" and the drive instruction signal "drp" will be described considering only the data input operation of the global input/output line GIO_A and GIO_B.

Also, the buffer enable signal "buf_enb" has a low-level potential in a refresh operation, while it has a high-level potential in a normal operation. Thus, the buffer enable signal "buf_enb" serves to stop the operations of the buffering unit 210 in the refresh operation to reduce current consumption.

With the enabling of the buffer enable signal "buf_enb", the buffering unit 210 compares the reference voltage Vref with the 1-bit bank address "oba" to generate the pair of address signals "add" and "/add". The first latch unit 220 generates the pair of latch signals "lat" and "/lat" in response to the enabled input instruction signal "inp" and transmits the latch signals "lat" and "/at" to the second latch unit 230. Likewise, the second latch unit 230 generates and outputs the pair of input control signals "icnt" and "/icnt" in response to the enabled drive instruction signal "drp". Each of the pair of address signals "add" and "/add", each of the pair of latch signals "lat" and "/lat", and each of the pair of input control signals "icnt" and "/icnt" may have opposite logic values.

Figure 3:
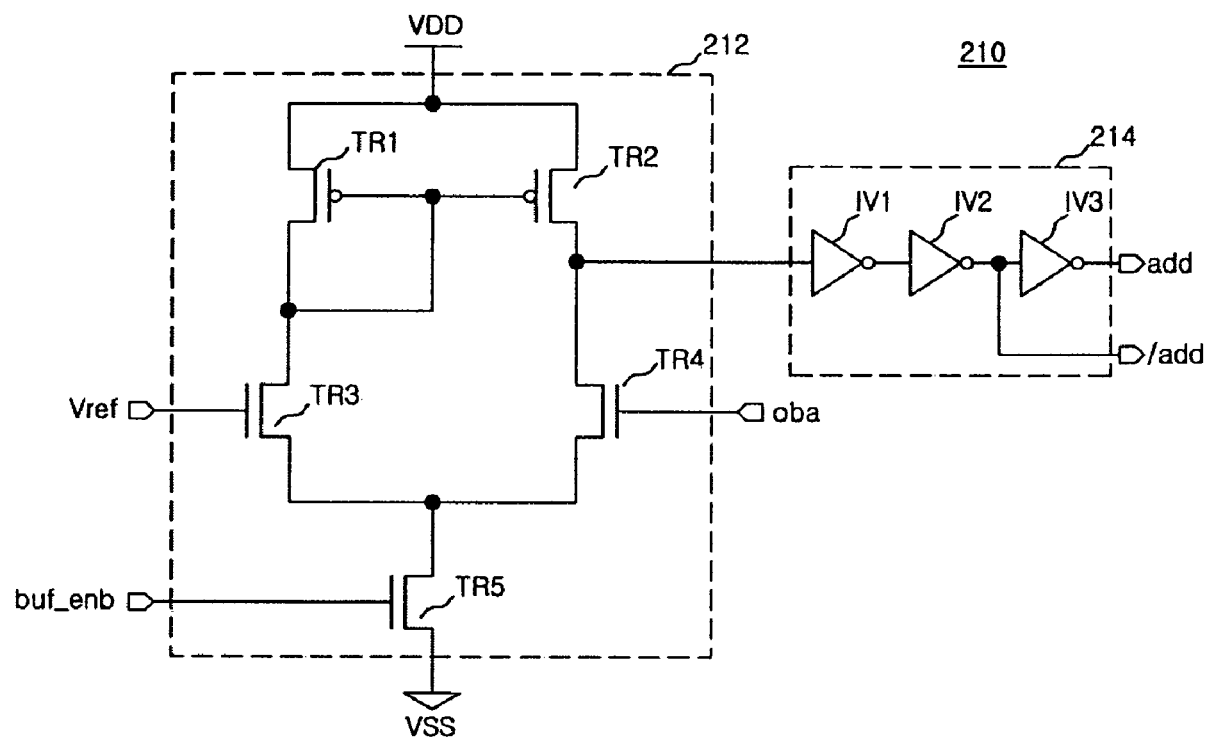
FIG. 3 is a detailed circuit diagram of a buffering unit shown in FIG. 2.

The buffering unit 210 includes a first comparison circuit 212 and a first drive circuit 214 as shown in FIG. 3. Specifically, the first comparison circuit 212 compares the reference voltage Vref with a potential of the 1-bit bank address "oba" depending on whether the buffer enable signal "buf_enb" is enabled or not. Also, the first drive circuit 214 generates the pair of address signals "add" and "/add" in response to an output signal of the first comparison circuit 212.

Here, the first comparison circuit 212 operates in response to the buffer enable signal "buf_enb". The first comparison circuit 212 may have a differential amplifier including five transistors TR1 to TR5 to compare the reference voltage Vref with a potential of the 1-bit bank address "oba".

The first drive circuit 214 may have a chain of three inverters IV1 to IV3 to drive the output signal of the first comparison circuit 212. An output signal of a second inverter IV2 is a negative address signal "/add", while an output signal of a third inverter IV3 is an address signal "add".

During the enabling of the buffer enable signal "buf_enb", when the 1-bit bank address "oba" has a low-level potential, which is lower than the reference voltage Vref, the output signal of the first comparison circuit 212 is at a high level. Thereafter, the address signal "add" is lowered to a low level owing to the inverting drive of the first drive circuit 214, while the negative address signal "/add" is elevated to a high level owing to the non-inverting drive of the first drive circuit 214.

On the other hand, when the 1-bit bank address "oba" has a high-level potential, which is higher than the reference voltage Vref, the output signal of the first comparison circuit 212 is at a low level. Thereafter, the address signal "add" is elevated to a high level owing to the inverting drive of the first drive circuit 214, while the negative address signal "/add" is lowered to a low level owing to the non-inverting drive of the first drive circuit 214.

In other words, the potentials of the address signals "add" and "/add" depend on the potential of the 1-bit bank address "oba". The potentials of the address signals "add" and "/add"

affect the potentials of the pair of input control signals "icnt" and "/icnt", which determine a memory bank region to which data is transmitted.

Figure 4:
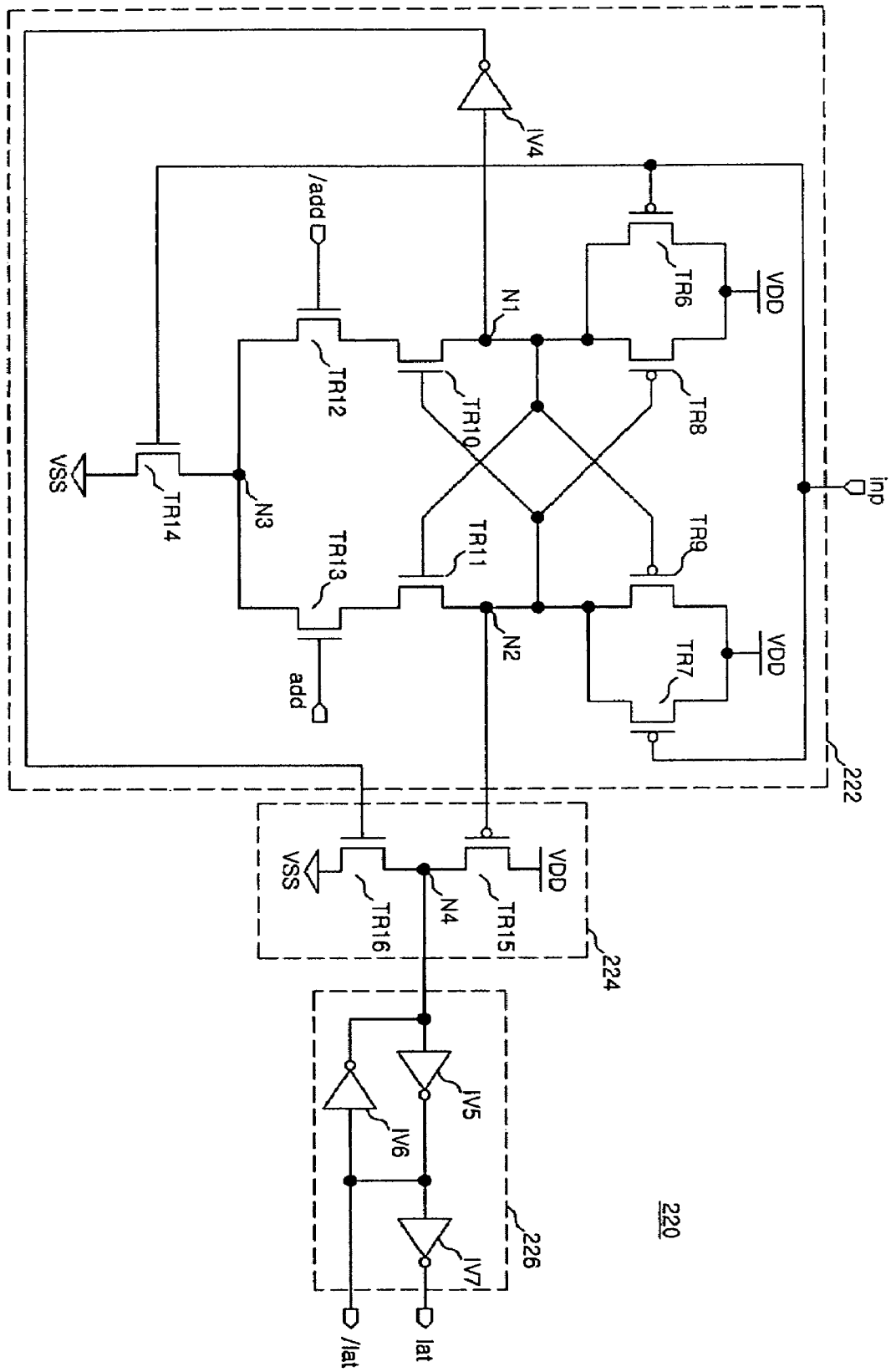
FIG. 4 is a detailed circuit diagram of a first latch unit shown in FIG. 2.

The first latch unit 220 includes a second comparison circuit 222, a signal generation circuit 224, and a second drive circuit 226 as shown in FIG. 4. Specifically, the second comparison circuit 222 compares the potentials of the address signals "add" and "/add" in response to the input instruction signal "inp". The signal generation circuit 224 generates a signal from an external power supply voltage VDD and a ground voltage VSS based on the comparison result of the second comparison circuit 222. Also, the second drive circuit 226 latches and drives the signal generated by the signal generation circuit 224 and generates the pair of latch signals "lat" and "/lat".

The second comparison circuit 222 includes sixth through fourteenth transistors TR6 to TR14 and a fourth inverter IV4. Specifically, the sixth transistor TR6 has a gate node to which the input instruction signal "inp" is input, a source node to which the external power supply voltage VDD is applied, and a drain node connected to a first node N1. The seventh transistor TR7 has a gate node to which the input instruction signal "inp" is input, a source node to which the external power supply voltage VDD is applied, and a drain node connected to a second node N2. The eighth transistor TR8 has a gate node connected to the second node N2, a source node to which the external power supply voltage VDD is applied, and a drain node connected to the first node N1. The ninth transistor TR9 has a gate node connected to the first node N1, a source node to which the external power supply voltage VDD is applied, and a drain node connected to the second node N2. The tenth transistor TR10 has a gate node connected to the second node N2 and a drain node connected to the first node N1. The eleventh transistor TR11 has a gate node connected to the first node N1 and a drain node connected to the second node N2. The twelfth transistor TR12 has a gate node to which the negative address signal "/add" is input, a drain node connected to a source node of the tenth transistor TR10, and a source node connected to a third node N3. The thirteenth transistor TR13 has a gate node to which the address signal "add" is input, a drain node connected to a source node of the eleventh transistor TR11, and a source node connected to the third node N3. The fourteenth transistor TR14 has a gate node to which the input instruction signal "inp" is input, a drain node connected to the third node N3, and a source node that is grounded. Also, the fourth inverter IV4 receives a signal applied to the first node N1.

The signal generation circuit 224 includes fifteenth and sixteenth transistors TR15 and TR16. The fifteenth transistor TR15 has a gate node connected to the second node N2, a source node to which the external power supply voltage VDD is applied, and a drain node connected to a fourth node N4. Also, the sixteenth transistor TR16 has a gate node to which an output signal of the fourth inverter IV4 is input, a drain node connected to the fourth node N4, and a source node that is grounded.

Finally, the second drive circuit 226 includes fifth to seventh inverters IV5 to IV7. The fifth inverter IV5 receives a signal applied to the fourth node N4 and outputs a negative latch signal "/lat". The sixth inverter IV6 forms a latch structure with the fifth inverter IV5. Also, the seventh inverter IV7 receives the negative latch signal "/lat" and outputs the latch signal "lat".

When the input instruction signal "inp" input to the first latch unit 220 is disabled, the sixth and seventh transistors TR6 and TR7 of the second comparison circuit 222 are turned on, and the fourteenth transistor TR14 is turned off. Thus, potentials at the first and second nodes N1 and N2 are elevated to a high level, and both the fifteenth and sixteenth transistors TR15 and TR16 of the signal generation circuit 224 are turned off, so that a potential at the fourth node N4 is floated. In this case, the pair of latch signals "lat" and "/lat" become signals with meaningless logic values, thus making subsequent operations of the second latch unit 230 meaningless.

Meanwhile, when the input instruction signal "inp" is enabled, both the sixth and seventh transistors TR6 and TR7 of the second comparison circuit 222 are turned off, and the fourteenth transistor TR14 is turned on. In this case, when the address signal "add" is at a higher potential level than the negative address signal "/add", the first node N1 is elevated to a high level, while the second node N2 is lowered to a low level. Thus, the signal generation circuit 224 performs a pull-up operation so that a potential at the fourth node N4 is elevated to a high level. Subsequently, the second drive circuit 226 performs its operations, and thus the latch signal "lat" is at a high level and the negative latch signal "/lat" is at a low level.

On the other hand, when the negative address signal "/add" is at a higher potential level than the address signal "add", the first node N1 is lowered to a low level, while the second node N2 is elevated to a high level. Thus, the signal generation circuit 224 performs a pull-down operation so that a potential at the fourth node N4 is lowered to a low level. Subsequently, the second drive circuit 226 performs its operation so that the latch signal "lat" is at a low level and the negative latch signal "/lat" is at a high level.

Figure 5:
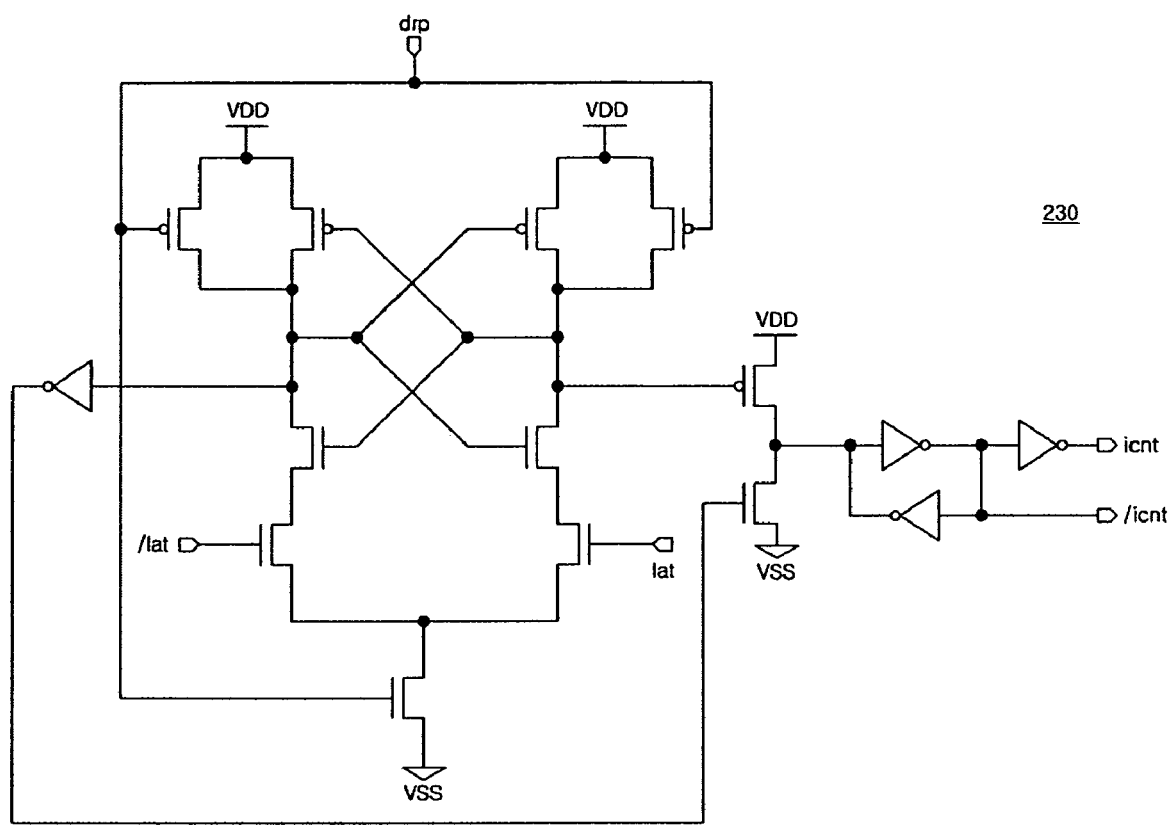
FIG. 5 is a detailed circuit diagram of a second latch unit shown in FIG. 2.

The second latch unit 230 has the same construction as the first latch unit 220 as illustrated in FIG. 5, but it is different from the first latch unit 220 in that the drive instruction signal "drp" is used instead of the input instruction signal "inp" and the pair of latch signals "lat" and "/lat" are used instead of the pair of address signals "add" and "/add".

Like in the first latch unit 220, during the enabling of the drive instruction signal "drp", when the latch signal "lat" has a higher potential level than the negative latch signal "/lat", the input control signal "icnt" is elevated to a high level, while the negative input control signal "/icnt" is lowered to a low level. In contrast, when the negative latch signal "/lat" has a higher potential level than the latch signal "lat", the input control signal "icnt" is lowered to a low level, while the input control signal "icnt" is elevated to a high level.

When the input control signal "icnt" has a high level, data is transmitted to some banks (e.g., bank 0 to bank 3) of a plurality of memory banks (e.g., 8 memory banks). On the other hand, when the input control signal "icnt" has a low level, data is transmitted to the remaining banks (e.g., bank 4 to bank 7).

In other words, during the enabling of the input instruction signal "inp" and the drive instruction signal "drp", when a potential of the 1-bit bank address "oba" has a high level, the address signal "add" output from the buffering unit 210 has a high level. Thus, the latch signal "lat" output from the first latch unit 220 has a high level. As a result, the input control signal "icnt" output from the second latch unit 220 is elevated to a high level.

On the other hand, when the 1-bit bank address "oba" has a low level, the negative address signal "/add" output from the buffering unit 210 has a high level. Thus, the negative latch signal "flat" output from the first latch unit 220 has a high level. As a result, the negative input control signal "/icnt" output from the second latch unit 220 is elevated to a high level.

The repeater 30 receives data from the global input/output line GIO and transmits the data to the global input/output line GIO corresponding to the pair of input control signal "icnt" and "/icnt" during the data input operation.

Figure 6:
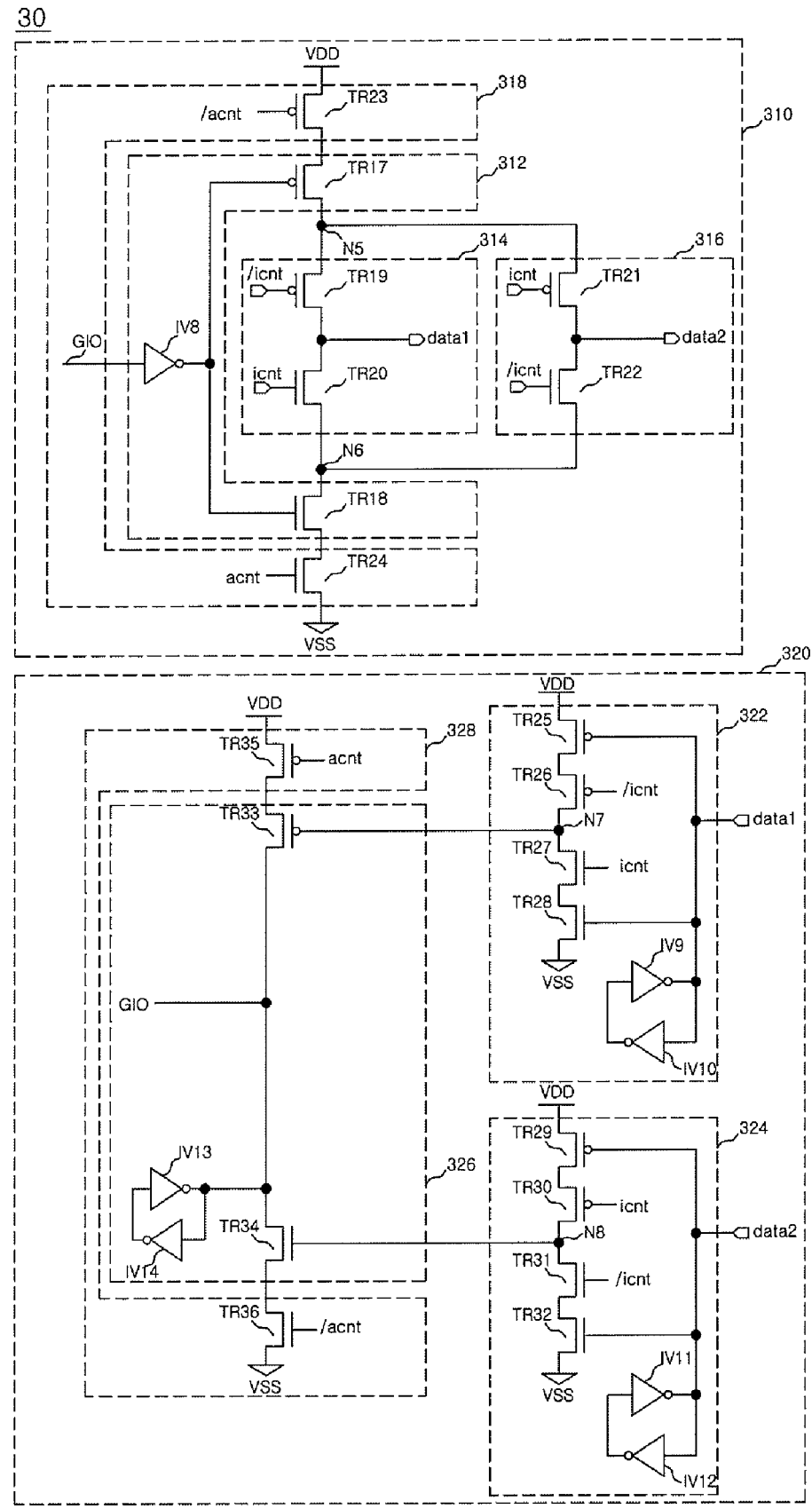
FIG. 6 is a detailed circuit diagram of a repeater shown in FIG. 1.

The repeater 30 receives data from the output sense amplifier 50 through the global input/output line GIO(GIO_B of FIG. 1) and outputs the data to the global input/output line GIO(GIO_A of FIG. 1) connected to the data output buffer 60 during the data output operation. As illustrated in FIG. 6, the repeater 30 includes an input repeater unit 310 and an output repeater unit 320. Specifically, the input repeater unit 310 receives data from the global input/output line GIO in response to the operation control signal "acnt" and transmits the data to the global input/output line GIO corresponding to the pair of input control signals "icnt" and "/icnt". The output repeater unit 320 receives data from the output sense amplifier 50 through the global input/output line GIO and outputs the data to the global input/output line GIO connected to the data output buffer 60.

The input repeater unit 310 includes a data supply circuit 312, a first data generation circuit 314, a second data generation circuit 316, and an input control circuit 318. The data supply circuit 312 supplies data from the global input/output line GIO. The first data generation circuit 314 drives data transmitted from the data supply circuit 312 according to potential levels of the pair of input control signals "icnt" and "/icnt" and generates first region data "data1". The second data generation circuit 316 drives data transmitted from the data supply circuit 312 according to potential levels of the pair of input control signals "icnt" and "/icnt" and generates second region data "data2". The input control circuit 318 controls the entire operation of the input repeater unit 310 in response to the operation control signal "acnt" and the negative operation control signal "/acnt".

In this case, the first region data "data1" refers to data transmitted to some input drivers 40 and a first memory bank region (e.g., bank 0 to bank 3) through some data input/output lines of the global input/output line GIO connected to an output terminal of the repeater 30. Data output from the first memory bank region and transmitted to the repeater 30 is also referred to as the first region data "data1".

Similarly, the second region data "data2" is output from the repeater 30, transmitted to the input drivers 40 other than the input drivers 40 to which the first region data "data1" is transmitted, and then driven and transmitted to a second memory bank region (e.g., bank 4 to bank 7). Data output from the second memory bank region and transmitted to the repeater 30 is also referred to as the second region data "data2".

The data supply circuit 312 includes an eighth inverter IV8 and seventeenth and eighteenth transistors TR17 and TR18. The eighth inverter IV8 receives data from the global input/output line GIO. The seventeenth transistor TR17 has a gate node to which an output signal of the eighth inverter IV8 is input, a source node connected to the input control circuit 318, and a drain node connected to a fifth node N5. The eighteenth transistor TR18 has a gate node to which the output signal of the eighth inverter IV8 is input, a drain node connected to a sixth node N6, and a source node connected to the input control circuit 318.

Also, the first data generation circuit 314 includes a nineteenth transistor TR19 and a twentieth transistor TR20. The nineteenth transistor TR19 has a gate node to which the negative input control signal "/icnt" is input, a source node connected to the fifth node N5, and a drain node connected to an output terminal of the first region data "data1". The twentieth transistor TR20 has a gate node to which the input control signal "icnt" is input, a drain node connected to the output terminal of the first region data "data1", and a source node connected to the sixth node N6.

The second data generation circuit 316 includes a twenty-first transistor TR21 and a twenty-second transistor TR22. The twenty-first transistor TR21 has a gate node to which the input control signal "icnt" is input, a source node connected to the fifth node N5, and a drain node connected to an output terminal of the second region data "data2". The twenty-second transistor TR22 has a gate node to which the negative input control signal "/icnt" is input, a drain node connected to the output terminal of the second region data "data2", and a source node connected to the sixth node N6.

Finally, the input control circuit 318 includes a twenty-third transistor TR23 and a twenty-fourth transistor TR24. The twenty-third transistor TR23 has a gate node to which the negative operation control signal "/acnt" is input, a source node to which the external power supply voltage VDD is applied, and a drain node connected to the source node of the seventeenth transistor TR17 of the data supply circuit 312. The twenty-fourth transistor TR24 has a gate node to which the operation control signal "acnt" is input, a drain node connected to the source node of the eighteenth transistor TR18 of the data supply circuit 312, and a source node that is grounded.

The output repeater unit 320 includes a first data input circuit 322, a second data input circuit 324, a data output circuit 326, and an output control circuit 328. Specifically, the first data input circuit 322 receives and drives the first region data "data1" transmitted from the first memory bank region according to potential levels of the pair of input control signals "icnt" and "/icnt". The second data input circuit 324 receives and drives the second region data "data2" transmitted from the second memory bank region according to the potential levels of the pair of input control signals "icnt" and "/icnt". The data output circuit 326 receives output data of the first data input circuit 322 and output data of the second data input circuit 324 and outputs the output data to the global input/output line GIO. Also, the output control circuit 328 controls the entire operation of the output repeater unit 320 in response to the pair of operation control signals "acnt" and "/acnt".

The first data input circuit 322 includes twenty-fifth to twenty-eighth transistors TR25 to TR28 and ninth and tenth inverters IV9 and IV10. Specifically, the twenty-fifth transistor TR25 has a gate node to which the first region data "data1" is input and a source node to which the external power supply voltage VDD is applied. The twenty-sixth transistor TR26 has a gate node to which the negative input control signal "/icnt" is input, a source node connected to a drain node of the twenty-fifth transistor TR25, and a drain node connected to a seventh node N7. The twenty-seventh transistor TR27 has a gate node to which the input control signal "icnt" is input and a drain node connected to the seventh node N7. The twenty-eighth transistor TR28 has a gate node to which the first region data "data1" is input, a drain node connected to a source node of the twenty-seventh transistor TR27, and a source node that is grounded. The ninth and tenth inverters IV9 and IV10 form a latch structure for the first region data "data1". In the first data input circuit 322, an output signal is generated at the seventh node N7.

Also, the second data input circuit 324 includes twenty-ninth to thirty-second transistors TR29 to TR32 and eleventh and twelfth inverters IV11 and IV12. Specifically, the twenty-ninth transistor TR29 has a gate node to which the second region data "data2" is input and a source node to which the external power supply voltage VDD is applied. The thirtieth transistor TR30 has a gate node to which the input control signal "icnt" is input, a source node connected to a drain node of the twenty-ninth transistor TR29, and a drain node connected to an eighth node N8. The thirty-first transistor TR31 has a gate node to which the negative input control signal "/icnt" is input and a drain node connected to the eighth node N8. A thirty-second transistor TR32 has a gate node to which the second region data "data2" is input, a drain node connected to a source node of the thirty-first transistor TR31, and a source node that is grounded. The eleventh and twelfth inverters IV11 and IV12 form a latch structure for the second region data "data2". In the second data input circuit 324, an output signal is generated at the eighth node N8.

The data output circuit 326 includes thirty-third and thirty-fourth transistors TR33 and TR34 and thirteenth and fourteenth inverters IV13 and IV14. Specifically, the thirty-third transistor TR33 has a gate node to which the output signal of the first data input circuit 322 is input, a source node connected to the output control circuit 328, and a drain node connected to the global input/output line GIO as an output terminal. The thirty-fourth transistor TR34 has a gate node to which the output signal of the second data input circuit 324 is input, a drain node connected to the global input/output line GIO as an output terminal, and a source node connected to the output control circuit 328. The thirteenth and fourteenth inverters IV13 and IV14 form a latch structure for signals at the output terminals.

The output control circuit 328 includes a thirty-fifth transistor TR35 and a thirty-sixth transistor TR36. The thirty-fifth transistor TR35 has a gate node to which the operation control signal "acnt" is input, a source node to which the external power supply voltage VDD is applied, and a drain node connected to the source node of the thirty-third transistor TR33 of the data output circuit 326. Also, the thirty-sixth transistor TR36 has a gate node to which the negative operation control signal "/acnt" is input, a drain node connected to the source node of the data output circuit 326, and a source node that is grounded.

In the repeater 30 having the above-described construction, when the operation control signal "acnt" is at a high level, the input repeater unit 310 is enabled and performs the data input operation, whereas when the operation control signal "acnt" is at a low level, the output repeater unit 320 is enabled and performs the data output operation.

More specifically, when the operation control signal "acnt" input to the repeater 30 is at a high level and the negative operation control signal "/acnt" input to the repeater 30 is at a low level, the repeater 30 performs the data input operation. In this case, when the input control signal "icnt" is at a high level and the negative input control signal "/icnt" is at a low level, the nineteenth and twentieth transistors TR19 and TR20 of the first data generation circuit 314 are turned on, and the twenty-first and twenty-second transistors TR21 and TR22 of the second data generation circuit 316 are turned off. Thus, data transmitted to the data supply circuit 312 is driven and output as the first region data "data1".

In contrast, when the input control signal "icnt" is at a low level and the negative input control signal "/icnt" is at a high level, the nineteenth and twentieth transistors TR19 and TR20 of the first data generation circuit 314 are turned off, and the twenty-first and twenty-second transistors TR21 and TR22 of the second data generation circuit 316 are turned on. Thus, data transmitted to the data supply unit 312 is driven and output as the second region data "data2".

The input driver 40 drives data transmitted from the repeater 30 and transmits the data to a local input/output line LIO connected to each memory bank. In the present embodiment, the data input/output circuit may include a plurality of input drivers 40.

The output sense amplifier 50 receives data from a plurality of memory banks through the local input/output line LIO and transmits the data through the global input/output line GIO to the repeater 30.

The data output buffer 60 buffers the data transmitted from the repeater 30 through the global input/output line GIO to output the buffered data as output data "odata".

As described above, the repeater 30 drives data transmitted from the global input/output line "GIO" according to the potential levels of the pair of input control signals "icnt" and "/icnt" and outputs the data as the first region data "data1" or the second region data "data2". In this case, only one of the first region data "data1" and the second region data "data2" is output according to the potential levels of the pair of input control signals "icnt" and "/icnt" and transmitted to an already allocated memory bank. In this construction, the data input/output circuit outputs only one of the first region data "data1" and the second region data "data2", thus reducing power consumption.

In other words, the semiconductor integrated circuit generates the pair of input control signals "icnt" and "/icnt" in response to the input of the 1-bit bank address "oba" so that data, which is output from the data input buffer 10 and transmitted from the global input/output line GIO to the repeater 30, can be selectively transmitted to some input drivers 40 and then transmitted to some memory banks. Therefore, data is not transmitted to the disabled memory banks during the data input operation so that unnecessary current generation can be prevented to reduce power consumption.

Since data is transmitted to only enabled memory bank regions during a data input operation, unnecessary current generation can be prevented, thus reducing power consumption.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus comprising:
    a control unit configured to generate a pair of input control signals according to a selecting information of memory banks for selecting global input/output lines corresponding to selected memory banks; and
    a repeater having an input repeater unit and an output repeater unit configured to mutually transmit data between the selected memory bank and the global input/output lines corresponding to the selected memory bank, in response to the input control signals,
    wherein the repeater is configured to allow a transmission of the data from or to the selected memory banks and to cut off a transmission of the data from or to non-selected memory banks.

2. The apparatus as set forth in claim 1,
    wherein the input repeater unit is configured to include a plurality of output nodes connected to the memory banks and to output the data through output nodes connected to the selected memory bank, and the output repeater unit is configured to include a plurality of input nodes connected to the memory banks and to receive the data through input nodes connected to the selected memory bank.

3. The apparatus as set forth in claim 1, wherein the selecting information of the memory bank is an address being one bit of a plural-bit bank address.

4. The apparatus as set forth in claim 2,
wherein the input repeater unit is configured to cut off an output of data to output nodes connected to non-selected memory banks, and
the output repeater unit is configured to cut off an input of data from input nodes connected to the non-selected memory bank.

5. The apparatus as set forth in claim 3, wherein the control unit comprises:
a buffering unit for receiving a reference voltage and a buffer enable signal and buffering the address for the memory bank region to generate a pair of address signals;
a first latch unit for latching the pair of address signals depending on whether an input instruction signal is enabled or not; and
a second latch unit for latching a pair of latch signals transmitted from the first latch unit depending on whether a drive instruction signal is enabled or not to generate the input control signal and the negative input control signal.

6. The apparatus as set forth in claim 5, wherein the buffering unit comprises:
a comparison circuit for comparing a potential of the address for the memory bank region with the reference voltage depending on whether the buffer enable signal is enabled or not and for producing an output signal based thereon; and
a drive circuit for driving the output signal of the comparison circuit to generate the pair of address signals.

7. The apparatus as set forth in claim 1, further comprising a plurality of input drivers configured to receive the data from the repeater to transmit the data to a local input/output line that is connected to the selected memory bank.

8. The apparatus as set forth in claim 5, wherein the first latch unit comprises:
a comparison circuit for comparing potentials of the pair of address signals in response to the input instruction signal;
a signal generation circuit for generating a signal from an external power supply voltage and a ground voltage based on the output of the comparison circuit; and
a drive circuit for latching and driving the signal generated by the signal generation circuit to generate the pair of latch signals.

9. The apparatus as set forth in claim 5, wherein the second latch unit comprises:
a comparison circuit for comparing potentials of the pair of latch signals in response to the drive instruction signal and for producing a comparison result based thereon;
a signal generation circuit for generating a signal from an external power supply voltage and a ground voltage based on the comparison result of the comparison circuit; and
a drive circuit for latching and driving the signal generated by the signal generation circuit to generate the pair of input control signals.

10. The apparatus as set forth in claim 4, wherein the input repeater unit comprises:

a data supply circuit for supplying data transmitted from the global input/output line;
a first data generation circuit for driving the data supplied from the data supply circuit according to potential levels of the input control signal and the negative input control signal, to provide the output nodes connected to the selected memory bank with the data;
a second data generation circuit for driving data transmitted from the data supply circuit according to the potential levels of the pair of input control signals, to provide the output nodes connected to the non-selected memory bank with the data; and
an input control circuit for controlling the entire operation of the repeater in response to an operation control signal.

11. A semiconductor memory apparatus comprising:
a control unit for receiving a bank address data on a memory bank region to be enabled among a plurality of memory banks to generate a pair of input control signals having an input control signal and a negative input control signal; and
a repeater for receiving data transmitted from a global input/output line to transmit the data to an input driver corresponding to the input control signal,
wherein the control unit includes:
a buffering unit for receiving a reference voltage and a buffer enable signal and buffering the bank address data to generate a pair of address signals;
a first latch unit for latching the pair of address signals depending on whether an input instruction signal is enabled or not; and
a second latch unit for latching a pair of latch signals transmitted from the first latch unit depending on whether a drive instruction signal is enabled or not to generate the input control signal and the negative input control signal.

12. The apparatus as set forth in claim 11, wherein a potential level of the input control signal is determined by data on the memory bank region to be enabled, and the control unit controls a data transmission path of the repeater according to the potential level of the input control signal.

13. The apparatus as set forth in claim 11, wherein the data on the memory bank region to be enabled is one bit of a plural-bit bank address.

14. The apparatus as set forth in claim 11, wherein the data output from the repeater comprises:
first region data transmitted to some input drivers of the memory banks; and
second region data transmitted to the input drivers that the first region data is not transmitted to.

15. The apparatus as set forth in claim 13, wherein the buffering unit comprises:
a comparison circuit for comparing a potential of the 1-bit bank address with the reference voltage depending on whether the buffer enable signal is enabled or not to produce an output signal; and
a drive circuit for driving the output signal of the comparison circuit to generate the pair of address signals.

16. The apparatus as set forth in claim 15, wherein the comparison circuit comprises a differential amplifier for operating in response to the input of the buffer enable signal and comparing the 1-bit bank address with the reference voltage.

17. The apparatus as set forth in claim 11, wherein the first latch unit comprises:
a comparison circuit for comparing potentials of the pair of address signals in response to the input instruction signal to produce a comparison result;

a signal generation circuit for generating a signal from an external power supply voltage and a ground voltage based on the comparison result of the comparison circuit; and a drive circuit for latching and driving the signal generated by the signal generation circuit to generate the pair of latch signals.

18. The apparatus as set forth in claim 11, wherein the second latch unit comprises:
   a comparison circuit for comparing potentials of the pair of latch signals in response to the drive instruction signal to produce a comparison result;
   a signal generation circuit for generating a signal from an external power supply voltage and a ground voltage based on the comparison result of the comparison circuit; and
   a drive circuit for latching and driving the signal generated by the signal generation circuit to generate the pair of input control signals.

19. The apparatus as set forth in claim 14, wherein the repeater comprises:
   a data supply circuit for supplying data transmitted from the global input/output line;
   a first data generation circuit for driving the data supplied from the data supply circuit according to potential levels of the input control signal and a negative input control signal to generate the first region data;
   a second data generation circuit for driving data transmitted from the data supply circuit according to the potential levels of the pair of input control signals to generate the second region data; and
   an input control circuit for controlling the entire operation of the repeater in response to an operation control signal.

20. The apparatus as set forth in claim 11, wherein the input driver drives data transmitted from the repeater and transmits the data to a local input/output line connected to the memory bank.

21. The apparatus as set forth in claim 11, further comprising a data input buffer for transmitting externally input data through the global input/output line to the repeater.

22. A semiconductor memory apparatus comprising a repeater for receiving data from a global input/output line to select a first bank group in response to the enabling of a pair of control signals having a control signal and a negative control signal and for receiving the data from the global input/output line to select a second bank group in response to the disabling of the control signal;
   a buffering unit for receiving a reference voltage and a buffer enable signal and buffering a 1-bit bank address to generate a pair of address signals;
   a first latch unit for latching the pair of address signals depending on whether an input instruction signal is enabled or not; and
   a second latch unit for latching a pair of latch signals transmitted from the first latch unit depending on whether a drive instruction signal is enabled or not to produce the control signal.

23. The apparatus as set forth in claim 22, wherein the first latch unit comprises:
   a comparison circuit for comparing potentials of the pair of address signals in response to the input instruction signal to produce a comparison result;
   a signal generation circuit for generating a signal from an external power supply voltage and a ground voltage based on the comparison result of the comparison circuit; and
   a drive circuit for latching and driving the signal generated by the signal generation circuit to generate the pair of latch signals.

24. The apparatus as set forth in claim 22, wherein the second latch unit comprises:
   a comparison circuit for comparing potentials of the pair of latch signals in response to the drive instruction signal to produce a comparison result;
   a signal generation circuit for generating a signal from an external power supply voltage and a ground voltage based on the comparison result of the comparison circuit; and
   a drive circuit for latching and driving the signal generated by the signal generation circuit to generate the control signal and a negative control signal.

25. The apparatus as set forth in claim 22, wherein the repeater comprises:
   a data supply circuit for supplying data transmitted from the global input/output line;
   a first data generation circuit for driving the data supplied from the data supply circuit according to potential levels of the control signal and the negative control signal to generate first region data;
   a second data generation circuit for driving data transmitted from the data supply circuit according to the potential levels of the pair of control signals to generate second region data; and
   an input control circuit for controlling the entire operation of the repeater in response to an operation control signal.

26. A method for inputting data using a semiconductor memory apparatus, the method comprising:
   generating a pair of input control signals having a input control signal and a negative control signal so that data is transmitted to only selected memory banks, to select a global input/output line to which data is transmitted;
   receiving data transmitted from the global input/output line to output the data to a global input/output line corresponding to the input control signal; and
   transmitting the output data to a local input/output line connected to the selected memory bank,
   wherein the data is transmitted to the selected memory banks and is not transmitted to non-selected memory banks, the semiconductor memory apparatus includes a repeater, and the repeater is configured to allow a transmission of the data from or to the selected memory banks and to cut off a transmission of the data from or to the non-selected memory banks.

27. The method as set forth in claim 26, wherein a potential level of the input control signal is determined by address storing selecting information of the memory bank, and
   generating the input control signal comprises controlling a transmission path of the data output to the corresponding global input/output line according to the potential level of the input control signal.

28. The method as set forth in claim 27, wherein the address is one bit of a plural-bit bank address.

29. The method as set forth in claim 26, wherein the data output to the global input/output line corresponding to the input control signal comprises:
   first region data transmitted to some memory banks of a plurality of memory banks; and
   second region data transmitted to memory banks that the first region data is not transmitted to.

30. The method as set forth in claim 27, wherein generating the input control signal comprises:

receiving a reference voltage and a buffer enable signal and buffering the address to generate a pair of address signals;

latching the pair of address signals depending on whether an input instruction signal is enabled or not to output a pair of latch signals; and latching the pair of latch signals depending on whether a drive instruction signal is enabled or not to generate the input control signal and a negative input control signal.

31. The method as set forth in claim 30, wherein generating the pair of address signals comprises:

comparing a potential of the address for the memory bank region with the reference voltage depending on whether the buffer enable signal is enabled or not; and driving an output signal of the comparison circuit to generate the pair of address signals.

32. The method as set forth in claim 30, wherein latching the pair of address signals comprises:

comparing potentials of the pair of address signals in response to the input instruction signal to produce a comparison result;

generating a signal from an external power supply voltage and a ground voltage based on the comparison result; and latching and driving the signal generated from the external power supply voltage and the ground voltage to generate the pair of latch signals.

33. The method as set forth in claim 30, wherein generating the input control signal and the negative input control signal comprises:

comparing potentials of the pair of latch signals in response to the drive instruction signal to produce a comparison result;

generating a signal from an external power supply voltage and a ground voltage based on the comparison result; and latching and driving the signal generated from the external power supply voltage and the ground voltage to generate the pair of input control signals.

34. The method as set forth in claim 29, wherein outputting data to the global input/output line corresponding to the input control signal comprises:

controlling the entire operation of outputting data to the global input/output line in response to an operation control signal;

supplying data transmitted from the global input/output line;

driving the supplied data according to potential levels of the input control signal and the negative input control signal to generate the first region data; and driving data transmitted in the step of outputting data to the global input/output line, according to the potential levels of the pair of input control signals to generate the second region data.

* * * * *